United States Patent
Zucker et al.

(10) Patent No.: US 7,212,554 B2
(45) Date of Patent: May 1, 2007

(54) WAVELENGTH STABILIZED LASER

(75) Inventors: Erik Paul Zucker, Los Altos, CA (US); Edmund L. Wolak, Palo Alto, CA (US); Vincent V. Wong, San Jose, CA (US); Chris Hart, West Melbourne, FL (US); Jay A. Skidmore, San Jose, CA (US); Randolph W. Hines, Melbourne, FL (US)

(73) Assignee: JDS Uniphase Corporation, Milpitas, CA (US)

( * ) Notice: Subject to any disclaimer, the term of this patent is extended or adjusted under 35 U.S.C. 154(b) by 262 days.

(21) Appl. No.: 10/953,798

(22) Filed: Sep. 29, 2004

(65) Prior Publication Data

US 2005/0265416 A1    Dec. 1, 2005

Related U.S. Application Data

(60) Provisional application No. 60/574,417, filed on May 26, 2004.

(51) Int. Cl.
    *H01S 3/13* (2006.01)
(52) U.S. Cl. .............. 372/29.02; 372/102; 372/99
(58) Field of Classification Search ............. 372/29.02, 372/102, 99
    See application file for complete search history.

(56) References Cited

U.S. PATENT DOCUMENTS

| 5,369,661 A | 11/1994 | Yamaguchi et al. |
| 5,790,576 A | 8/1998 | Waarts et al. |
| 6,041,072 A * | 3/2000 | Ventrudo et al. ........... 372/102 |
| 6,229,940 B1 | 5/2001 | Rice et al. |
| 6,404,542 B1 | 6/2002 | Ziari et al. |
| 7,031,573 B2 * | 4/2006 | Volodin et al. ............... 385/37 |
| 2003/0219205 A1 | 11/2003 | Volodin et al. |

FOREIGN PATENT DOCUMENTS

JP    06196802    7/1994

OTHER PUBLICATIONS

Optical Alignment for Wavelength Locking by Use of a LuxxMaster Element, PD-LD Inc. NJ.

* cited by examiner

*Primary Examiner*—Dung T. Nguyen
(74) *Attorney, Agent, or Firm*—Allen, Dyer, Doppelt, Milbrath & Gilchrist, P.A.

(57) ABSTRACT

A high power light source having an array, bundle or separate plurality of laser diodes coupled to a same number of multimode waveguides to collect beams of light emitted from the of laser diodes is provided. An optical combiner receives the beams of light and combines the beams of light into a single forward propagating beam of light so that substantially all optical radiation within each beam of light overlaps the optical radiation each other beam to form the single beam. A reflective element is located to receive the single forward propagating beam of light and transmits greater than 60% of the single forward propagating beam of light therethrough. The reflective element reflects between 3–40% of the single forward propagating beam back to the laser diodes as feedback to stabilize said laser diodes.

16 Claims, 7 Drawing Sheets

WAVELENGTH STABILIZED LASER

CROSS-REFERENCE TO RELATED APPLICATION

This application claims priority of U.S. Provisional Patent Application No. 60/574,417 filed May 26, 2004, entitled "Wavelength Stabilized Pump Combiner Tray" which is incorporated herein by reference for all purposes.

FIELD OF THE INVENTION

This invention relates generally to laser diodes and more particularly to the coupling of plural laser diode sources into a single high powered optical beam.

BACKGROUND OF THE INVENTION

Figure 1:
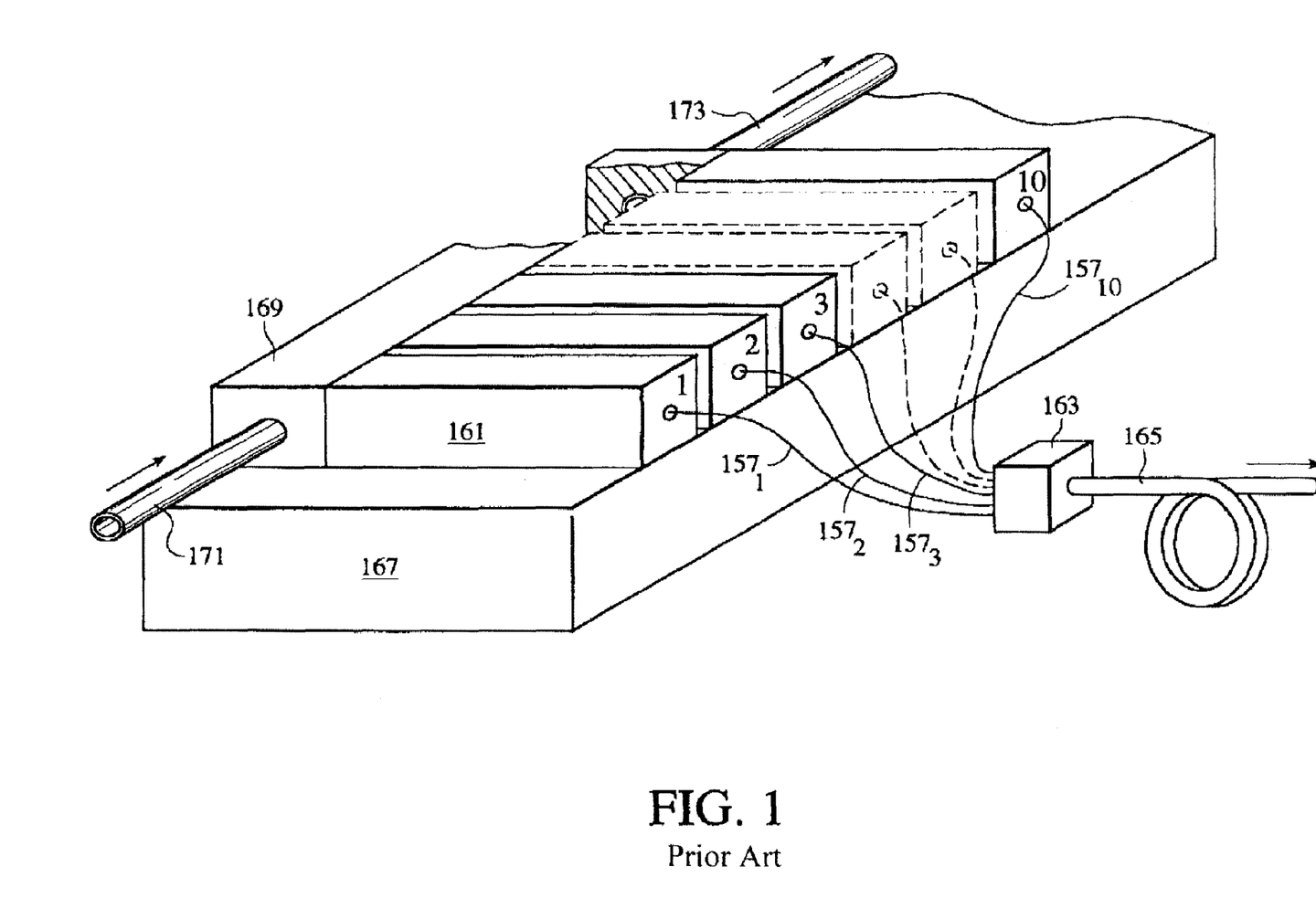
FIG. 1 corresponds to FIG. 12 of U.S. Pat. No. 5,790,576, and shows a prior art high power light source wherein plural laser diodes are combined and are output on a single optical fiber.

Coupling multiple laser diodes together to form a single high powered light source is known and is described by Robert Waarts et al. in U.S. Pat. No. 5,790,576, incorporated herein by reference, issued Apr. 4, 1998 assigned to JDS Uniphase Corporation. FIG. 12 of this patent is shown as FIG. 1 here, wherein a plurality of laser diodes 161, labeled 1, 2, 3, . . . , to 10 in FIG. 14. The specification states that their output fibers $157_1$, $157_2$, $157_3$, . . ., $157_{10}$ can be formed into a fiber bundle, or combined in a fiber coupler 163 to provide a single high power (1 kW) fiber output 165. The optical fiber 165 can also be a double-clad fiber. Other methods of beam combining, including free-space beam combining, polarization combining, or both, may also be used. Alternatively, but less preferably, a fiber bundle could be coupled to a large multimode fiber wherein the beams are combined within the multimode fiber.

In U.S. Pat. No. 5,369,661, Yamaguchi et al. disclose an optical system for coupling light from a semiconductor laser array into a solid-state laser medium or into an optical fiber. The optics include a gradient index (GRIN) lens array to condense the individual light beams emitted with a large divergence angle from the semiconductor laser array to form parallel collimated light beams.

In U.S. Pat. No. 6,229,940 incorporated herein by reference, to Rice et al. disclose a incoherent fiber optic laser system which provides an output beam that is scalable and which can be focused to a target location located relatively near or relatively far without requiring sophisticated optical elements. The incoherent fiber optic laser system includes a plurality of single mode laser sources, such as a plurality of fiber optic amplifiers, for providing single mode laser signals. The laser sources, such as the fiber optic amplifiers, operate incoherently with respect to one another such that the resulting laser signals are also incoherent. The incoherent fiber optic laser system also generally includes a plurality of single mode optical fibers for routing the incoherent laser signals as desired. In addition, the incoherent fiber optic laser system can include a plurality of lenses for collimating the incoherent laser signals provided by respective ones of the single mode optical fibers. In one advantageous embodiment, the incoherent fiber optic laser system also includes means for combining and focusing the collimated, incoherent laser signals to a target location at a predetermined distance.

In some respects the instant invention is related to the above-mentioned prior art; however, in contrast, this invention provides a high-power wavelength stabilized source of laser light that results from an optical system having plural laser diodes in an optical feedback stabilized system, wherein a portion of light received from plural multimode diode laser diode sources is fed back from a single partially reflective element to each of the laser diodes. A novel aspect of this invention relies on splitting a single feedback optical signal into n separate sub-signals to feedback to n laser diodes. Another novel aspect of this invention is the use of a substantially same region of a single grating or reflective element to provide feedback to multiple laser diodes.

This invention allows light emitted from n laser diodes to mix to form a single beam of mixed light that will impinge upon a downstream single partially reflective element that will provide feedback to the laser diodes in the form of a single mixed reflected signal that will be divided into n feedback signals so that each of the n laser diodes receives some radiation it generated along with some radiation generated from the n−1 other laser diodes as feedback light.

It is an object of this invention to provide a high-powered laser output signal at relatively low cost using commercially available components.

Although a preferred embodiment utilizes a grating element to provide optical feedback, the use of grating elements to provide feedback to a laser cavity is not novel; for example PD-LD Inc. of Pennington, N.J., USA, discloses the use of a Luxxmaster™ volume Bragg grating (VBG) element for use in stabilizing a fixed array of diode laser elements. This disclosure is currently published on the Internet at: http://www.pd-ld.com/pdf/VBGAlignmentProcedure100703.pdf. Illustrated is the use of a plurality of optical beams each targeted upon different locations of a volume hologram for providing optical feedback to stabilize the lasers. Although this scheme appears to perform as described, it is believed to have some drawbacks and limitations that the instant invention attempts to overcome. It also appears to be suited to an array of laser diodes but does not appear to be well suited to a system wherein the laser diodes are discrete separate elements or bundled optical fibers. One potential problem utilizing an array of laser diodes is that if one becomes faulty or stops functioning, that single laser element within an array of elements cannot simply be replaced. Another potential limitation of the arrangement shown in the Luxxmaster™ disclosure is that the laser light from each laser diode does not impinge upon a same region of a single reflective element, thereby potentially having a slightly different response for different reflective elements. U.S. patent application 20030219205 incorporated herein by reference in the name of Volodin et al. discloses configurations and uses of VBGs.

It is an object of this invention to generate a high-powered laser output signal from a plurality of laser diodes wherein only a single grating or reflector is required to stabilize the plurality of laser diodes.

It is a further object of this invention to generate a high-powered laser having a single output beam that is wavelength stabilized by optical feedback using a partially reflecting element coupled to plural diode lasers, wherein the reflecting element may be in-line with a multimode fiber or may be a VBG optically coupled to a receive a single beam of light from a beam combiner.

SUMMARY OF THE INVENTION

In accordance with the invention there is provided, a high power light source comprising: a plurality of laser diodes; a plurality of multimode waveguides each having an end optically coupled to one of the plurality of laser diodes so as to collect beams of light emitted from the plurality of laser diodes and guide said beams of light propagating in a forward direction to a first collection location and for guiding light traversing said multimode fibers in an opposite direction to the plurality of laser diodes; an optical combiner disposed to receive the beams of light propagating in the forward direction from the first collection location and for combining said beams of light into a single forward propagating beam of light so that substantially all optical radiation within each beam of light overlaps the optical radiation each other beam to form the single beam, and for separating a received beam of light traversing in an opposite direction into separate beams of light at the collection location for providing optical feedback to the plurality of laser diodes; and, an at least partially reflective element disposed to receive the single forward propagating beam of light for transmitting greater than 60% of the single forward propagating beam of light therethrough, and for reflecting between 3–40% of the single forward propagating beam back to the laser diodes as feedback to stabilize said laser diodes.

The at least partially reflecting element may be a filter having a bandwidth of 1 to 7 nm with a reflectivity of 5 to 40%. Preferably, the at least reflecting element is a filter having a bandwidth of 1 to 7 nm with a reflectivity of 10 to 20%, wherein the reflectivity of 10 to 20% is for a beam having a center wavelengths of at least one of 792 nm, 808 nm, 915 nm, 938 nm, and 976 nm.

In accordance with another aspect of the invention, there is provided, a high power light source comprising:

a) a plurality of laser diodes;

b) a plurality of multimode waveguides each having an end optically coupled to one of the plurality of laser diodes so as to collect beams of light emitted from the plurality of laser diodes and guide said beams of light propagating in a forward direction to a first collection location and for guiding light traversing said multimode fibers in an opposite direction to the plurality of laser diodes;

c) an optical combiner disposed to receive the beams of light propagating in the forward direction from the first collection location and for combining said beams of light into a single forward propagating beam of light so that substantially all optical radiation within each beam of light overlaps the optical radiation each other beam to form the single beam, and for separating a received beam of light traversing in an opposite direction into separate beams of light at the collection location for providing optical feedback to the plurality of laser diodes; and, d) an at least partially reflective element disposed to receive the single forward propagating beam of light for directing greater than 60% of the single forward propagating beam of light as a transmission beam to an output location, and for reflecting between 3–40% of the single forward propagating beam back to the laser diodes as feedback to stabilize said laser diodes.

BRIEF DESCRIPTION OF THE DRAWINGS

Exemplary embodiments of the invention will now be described in conjunction with the drawings in which.

DETAILED DESCRIPTION

Figure 2:
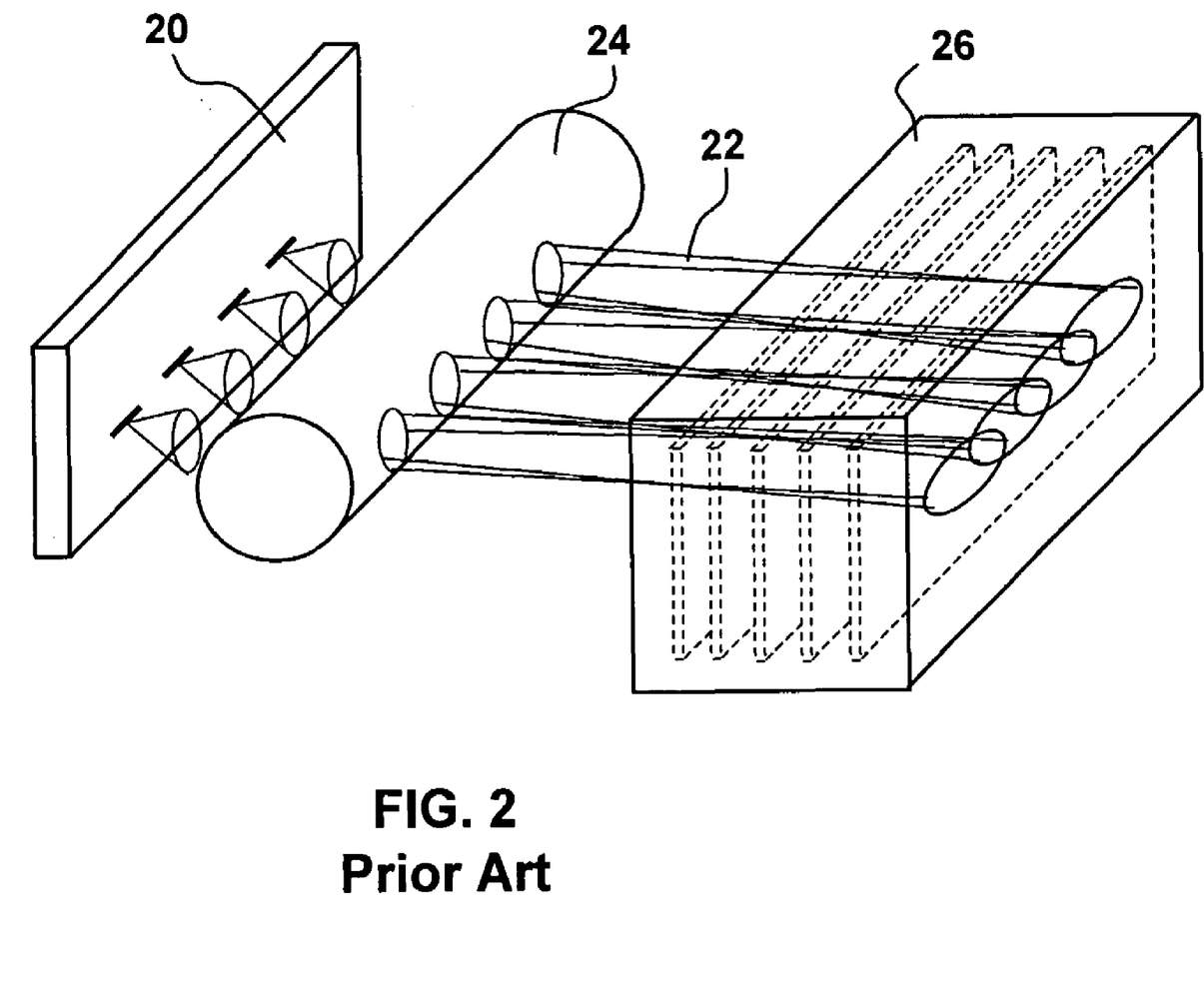
FIG. 2 is a prior art diagram of a laser diode bar is shown where wavelength locking is achieved by provision of a partially reflective Luxxmaster™ holographic element.

Referring now to FIG. 2, a laser diode bar is shown where wavelength locking is achieved by provision of a partially reflective Luxxmaster™ holographic element in the paths of light beams launched from an array of laser diodes. A diode laser bar 20 having four emitting stripes, emits light that is incident upon a cylindrical collimating microlens element 24 which provides four substantially collimated beams 22 to the Luxxmaster™ holographic element 26. The beams exiting the collimating microlens element 24 are separate as they are incident upon the holographic element 26 and slightly overlap as they exit the holographic element 26.

As will be described hereafter, the instant invention in contrast to the arrangement shown in FIG. 2, provides a laser system wherein beams emitted from plural diode lasers are combined to completely overlap or mix to form a single beam that is subsequently provided to a same region or location or spot on a single reflecting element; all of the light from any one of the plural diodes overlaps all of the light from the other diodes so that the light from each diode maps onto a same region; instead of plural spots or plural partially overlapping spots as is shown in FIG. 2 of the prior art.

Figure 3:
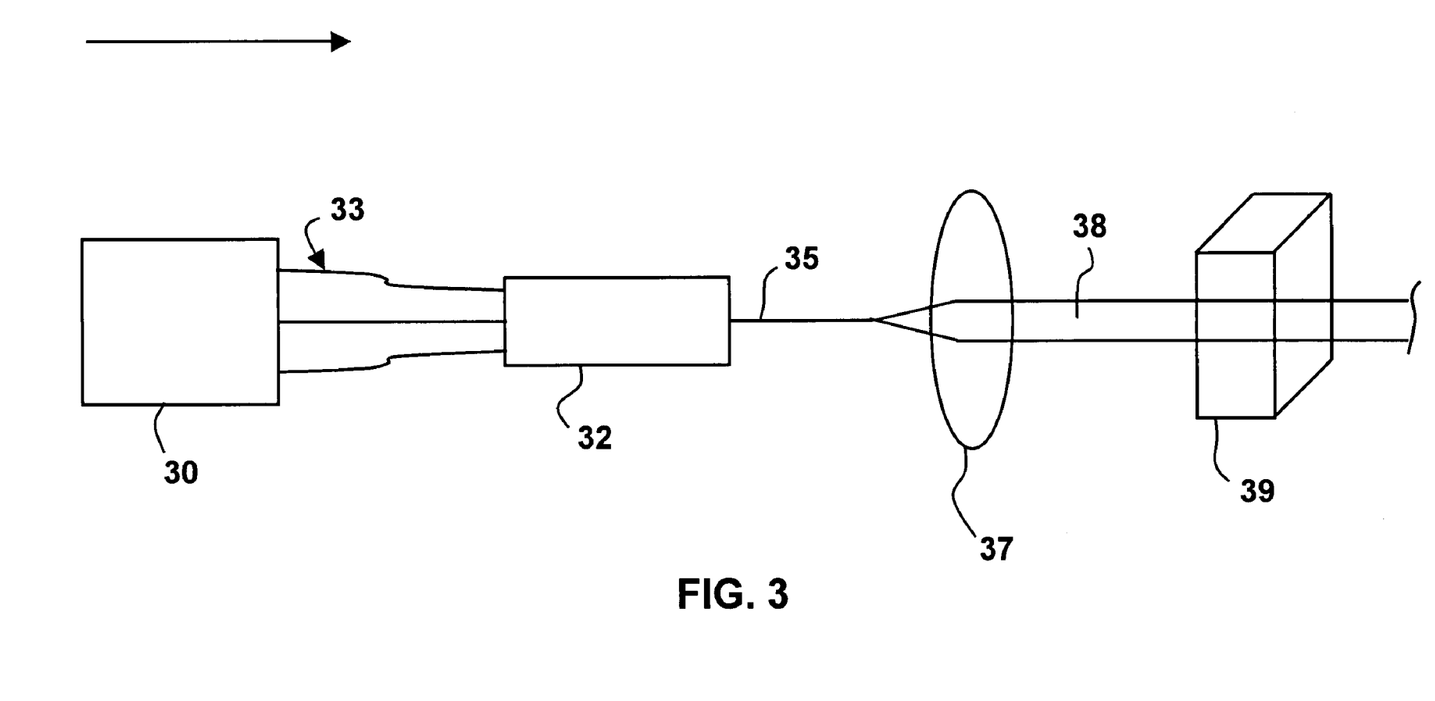
FIG. 3 is a schematic diagram of an embodiment of the invention wherein plural laser diodes have their outputs coupled to a combiner via multimode optical fiber and wherein the combiner is optically coupled to a volume hologram via a single multimode fiber.

In FIG. 3 an embodiment of the invention is shown wherein sixty-one laser diodes 30 are optically coupled to a combiner element 32 via sixty-one multimode optical fibers 33, wherein only three are shown, for combining the optical power output by the laser diodes 30 into a single multimode optical fiber 35. The loss incurred by at the coupler is about 1% leaving approximately 99% of the light on the single multimode optical fiber 35. As the combined light exits the fiber 35 it is preferably collimated by a collimating optical element in the form of a lens 37 into a single substantially collimated beam 38 directed to impinge onto one or more volume Bragg gratings (VBGs) 39. In operation, as the single substantially collimated beam 38 is incident upon the VBG, approximately 76.8% of the light energy is transmitted through and a remaining portion of the beam 38, approximately 20% with losses taken into consideration, is reflected backwards towards the laser diodes. The combiner element 32 shown can be any form of combiner including a combiner formed of one or more lenses or a fiber bundle combiner. Optical combiners are commercially available from JDS Uniphase Corporation offering combiners that couple 10, 16, or 20 multimode fiber inputs into a single multimode output. These fiber combiners are useful components when coupling power from several multimode laser diodes to create a single, high-power output source. It is preferred that the lens 37 provides a substantially concentric beam about an optical axis along which the beam propagates so that the mixed light occupies a substantially circular region upon the face of the VBG 39.

Although the arrangement shown in FIG. 3 utilizes a single multimode optical fiber at the output of the combiner element 32, other configurations can be envisaged, for example, wherein the beams from the laser diodes are fully combined in another manner into a single output beam directed to a same region on a partial reflector.

Figure 4:
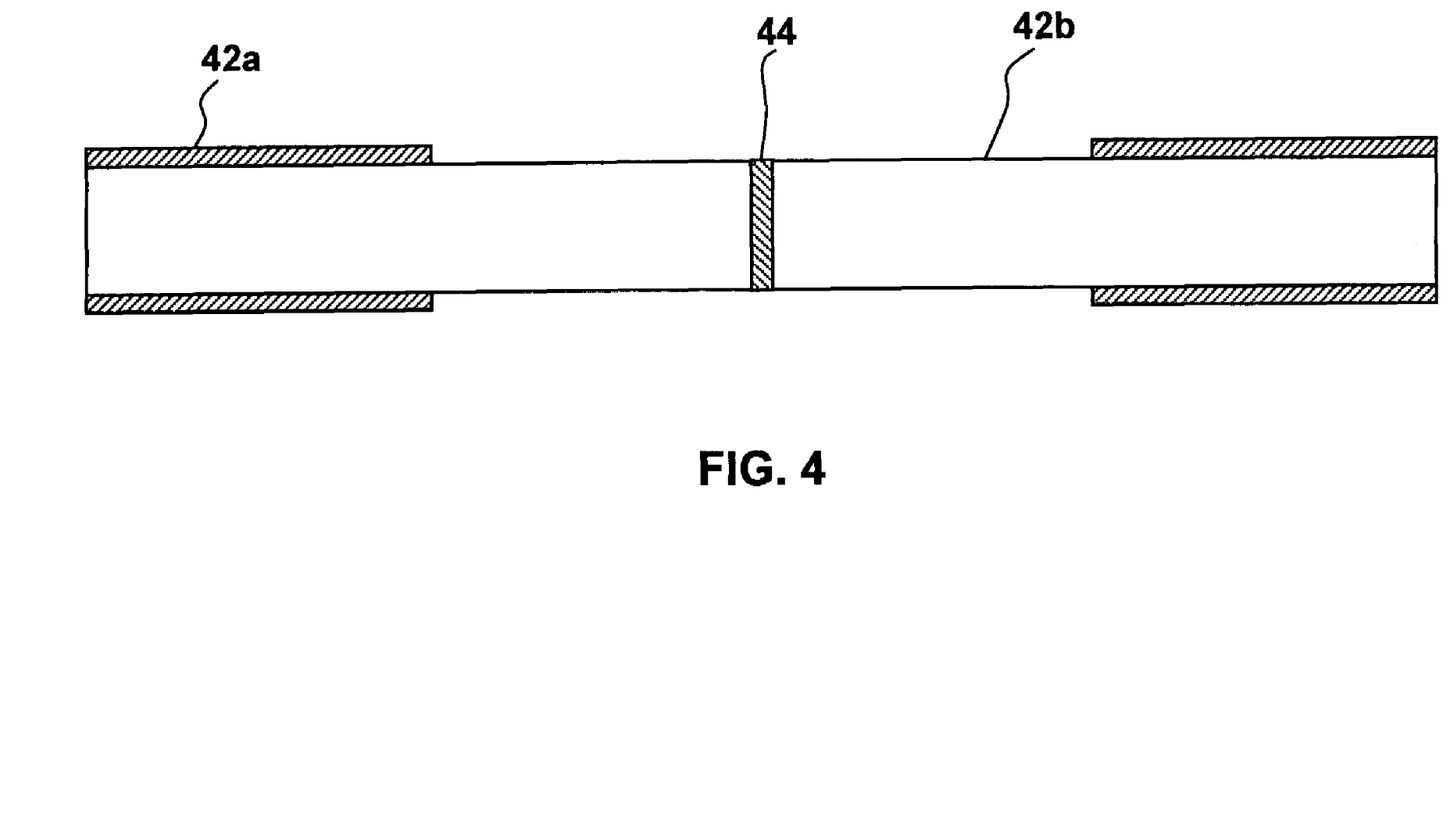
FIG. 4 is a drawing illustrating an embodiment of the invention wherein two sections of multimode fiber having a filter sandwiched therebetween are disposed to received combined light from a combiner.

In FIG. 4 an alternative arrangement is shown wherein two multimode fibers 42a and 42b having their ends cleaved or polished are abutted end-to-end, and wherein a multilayer coating 44 is deposited on one of the ends 42b prior to abutting the two ends. In this way, the multilayer coating or filter 44 is in-line and sandwiched between the fibers 42a 42b, and appearing to be contiguous with the fibers 42a and 42b. In the manufacturing process, care must be taken to preserve the integrity of the coating when the second fiber is abutted to the coating upon the first optical fiber. Alternatively, it may be possible to write a grating within a multimode fiber that will provide the desired reflectivity and bandwidth to provide a desired optical feedback.

The multilayer coating preferably has a narrow band of reflectivity. More specifically, by way of example the coating would be antireflection coated to less than 1% reflectivity from 10 nm ± to within 4 nm ± from the center wavelength of the laser. The reflectivity of the coating would preferably be <2% for ±2 nm about the center wavelength of the laser.

Examples of the laser center wavelength are:
808 nm, 792 nm, 938 nm, 973 nm, 976 nm and 980 nm.

An example for the filter parameters if the center wavelength of the laser is 938.5 is, for reflectivity at normal incidence:
910 nm to 934 nm: less than 1%
934 nm to 936 nm: less than 7%
936 nm to 941 nm: 5–10%
941 nm to 943 nm: less than 7%
943 to 960 nm: less than 1%

Figure 6:
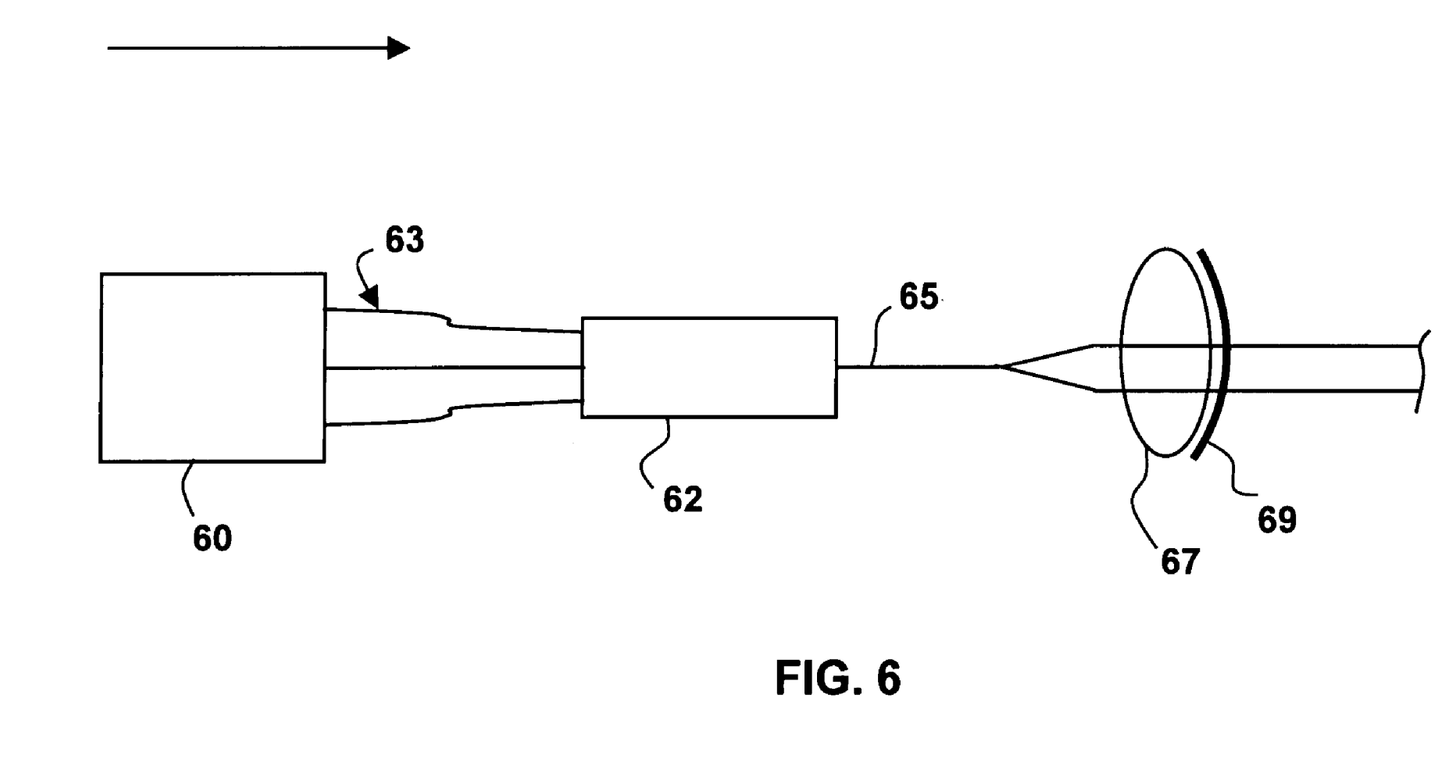
FIG. 6 is a schematic diagram illustrating an embodiment of the invention wherein a plurality of sources, an optical fiber combiner, a single multi-mode fiber and a collimating lens having a partially reflecting coating applied to an end face thereof, with AR coating on the other face, is shown.

The coatings can be deposited on the output ends of the combined optical fiber 35 shown in FIG. 3 instead of providing a VBG. Alternatively the coatings can be deposited on the collimating lens shown in FIG. 3 obviating the requirement for the VBG 39. This is shown in FIG. 6.

Unlike other prior art laser systems where only a small portion of light is reflected back to the laser cavity, in this instance a substantially larger portion of light, for example more than 10% and upwards, to 40% may be utilized as feedback light, since this light, upon its return to the combiner, must be split and divided among the many multimode fibers so that a required small portion reaches each laser cavity for wavelength stabilization to within desired limits. Novel to this invention is the sharing of a single partially reflecting element to light combined into a single beam, and the splitting of return light to various lasers from where the light was generated. It is believed that this provides a cost effective wavelength stabilized system that is easy to repair if one of the lasers becomes faulty. In this instance, it can be replaced without replacement of other working lasers.

Various forms of optical feedback for stabilizing a laser cavity are well known. For example this is described by Ventrudo in U.S. Pat. Nos. 5,485,481, and 6,661,819 incorporated herein by reference, and is also described in U.S. Pat. No. 6,525,872 in the name of Ziari et al. incorporated herein by reference, all assigned to JDS Uniphase Corporation In optical feedback, when a small portion k of laser radiation power P is coherently returned into the laser cavity so that the returned light is coherent with the laser light in the laser cavity, optical cavity loss L is reduced by a small amount $\Delta L \sim \sqrt{k}$ where k is a power feedback coefficient defined as a ratio of the returned power to the emitted power. A frequency-selective feedback provided by a frequency-selective reflector having a reflection bandwidth $\Delta \lambda$ decreases optical loss in the cavity only for those laser modes having wavelength within the reflection bandwidth $\Delta \lambda$, thereby discriminating other laser modes having a wavelength outside of the reflection bandwidth. In absence of this feedback-induced loss discrimination, the laser wavelength spectrum can change during operation because of small changes in laser gain spectrum due to e.g. pump current fluctuations, changes in laser temperature, laser aging etc; these changes can decrease optical gain for currently lasing modes relatively to optical gain for another mode or group of modes currently not lasing, thereby causing the change in laser spectrum. By providing loss discrimination exceeding expected relative gain variation during laser operation, the laser spectrum can be stabilized within the reflection bandwidth of the external feedback reflection bandwidth $\Delta \lambda$.

In another non-coherent mechanism of laser stabilization by external optical feedback, the return of a small portion of laser radiation back into the laser cavity induces a dynamic feedback effect known as a coherence collapse, wherein a coherence length of the laser radiation decreases to become less than a distance between the reflector and the laser, and the laser spectrum considerably widens. If the feedback wavelength bandwidth $\Delta \lambda$ is somewhat smaller than the laser spectrum bandwidth would have been in the state of coherence collapse induced by a non-selective reflector, and the feedback-induced loss discrimination is large enough to prevent sudden spectral jumps of the laser radiation outside of the bandwidth $\Delta \lambda$, the laser will operate with a stable spectrum occupying the bandwidth $\Delta \lambda$ and shaped by the selectivity of the external reflector.

The aforementioned prior art solutions describe optical feedback-stabilized systems for one or more diode lasers stabilized by respectively one or more of feedback signals, and wherein a reflected portion of optical radiation of a laser is returned back substantially into the same laser, even when a plurality of laser diodes, e.g. constituting a laser diode array, is stabilized simultaneously by constructionally same external reflector.

Conversely, the present invention employs a multimode beam combiner wherein light of different lasers is substantially intermixed, so that if the combiner intermixes laser beams of N individual lasers, a reflected portion $\Delta P_i$ of the radiation of i-th laser is divided between all N lasers upon return into the combiner. As a result, only $\sim 1/N^{th}$ of the returned portion $\Delta P_i$ of the radiation of i-th laser may be returned back into the i-th laser cavity, reducing therefore the effective feedback level N-fold in the case of the coherent stabilization mechanism.

On the other hand, an approximately $1/N^{th}$ portion of the reflected radiation of all other N−1 lasers is also injected into the i-th laser cavity, providing a dynamic coupling between all N−1 lasers. It is believed, but not verified; that this dynamic coupling is may be capable of inducing a coherence collapse regime for all N lasers simultaneously.

Figure 5:
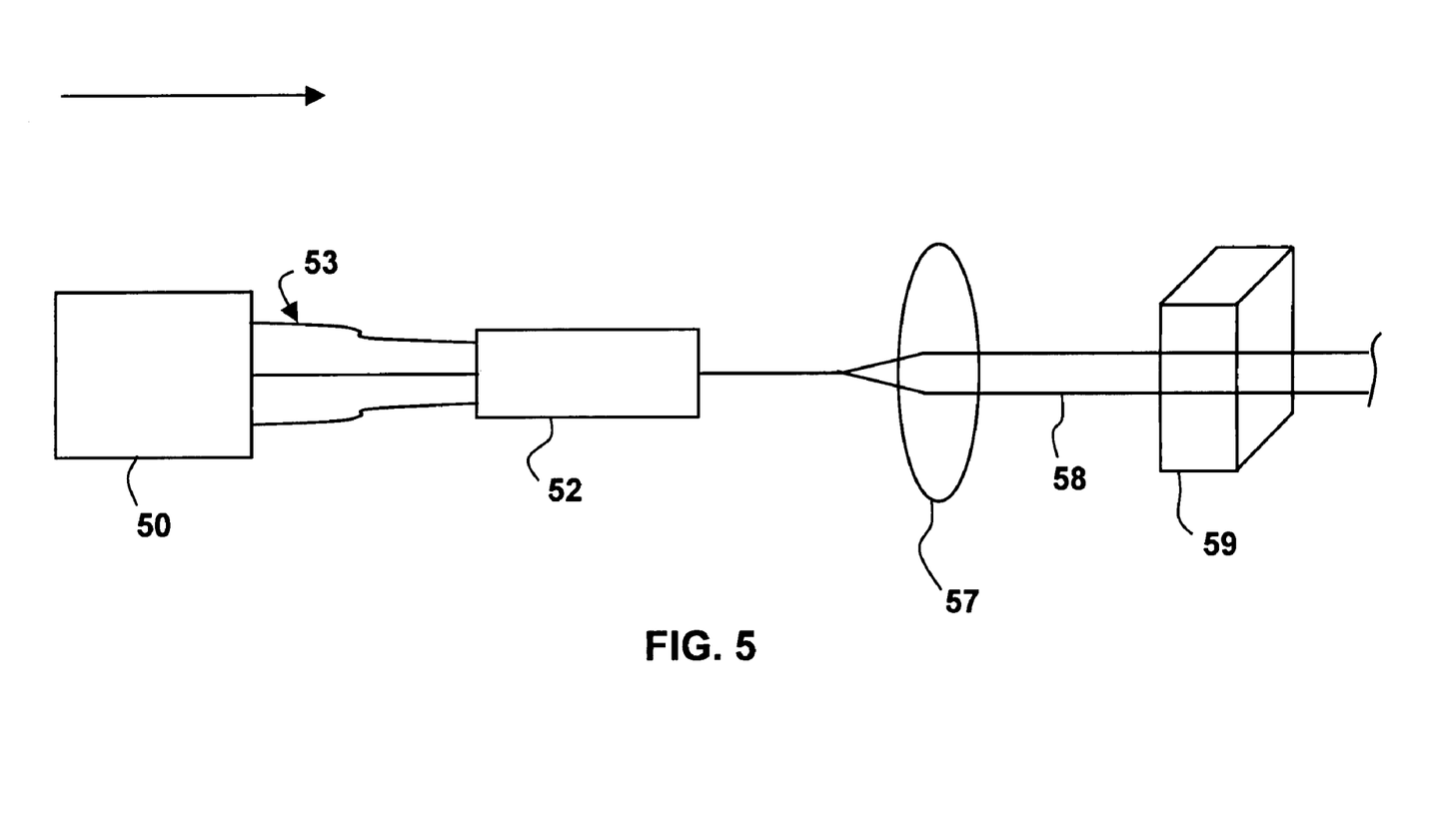
FIG. 5 is a schematic diagram illustrating an alternative embodiment of the invention wherein free-space optics is used from the combiner to a reflecting element.

Turning now to FIG. 5 an embodiment of the invention is shown wherein sixty-one laser diodes 50 are optically coupled to a combiner element 52 via sixty-one multimode optical fibers 53, wherein only three are shown, for combining the optical power output by the laser diodes 50 into a beam. This embodiment is absent the optical fiber 35 shown in FIG. 3. The loss incurred by at the coupler is about 1% leaving approximately 99% of the light on the single multimode optical fiber 35. As the combined light exits the lens 57 it is preferably collimated into a single substantially collimated beam 58 directed to impinge onto one or more volume Bragg gratings (VBGs) 59. In operation, as the single substantially collimated beam 58 is incident upon the VBG, approximately 76.8% of the light energy is transmitted through and a remaining portion of the beam 58, approximately 20% with losses taken into consideration, is reflected backwards towards the laser diodes. The combiner element 52 shown can be any form of combiner including a combiner formed of one or more lenses or a fiber bundle combiner.

Referring now to FIG. 6, an embodiment of the invention is shown wherein laser diodes 60 are optically coupled to a combiner element 62 via multimode optical fibers 63, wherein only three are shown, for combining the optical power output by the laser diodes 60 into a single multimode optical fiber 65. A filter 69 is shown to be coated on an end of a lens 67. Optionally a transparent substrate may be provided to support the filter at or on the end of the lens. In yet another embodiment a washer type donut shaped filter support may be used.

Figure 7:
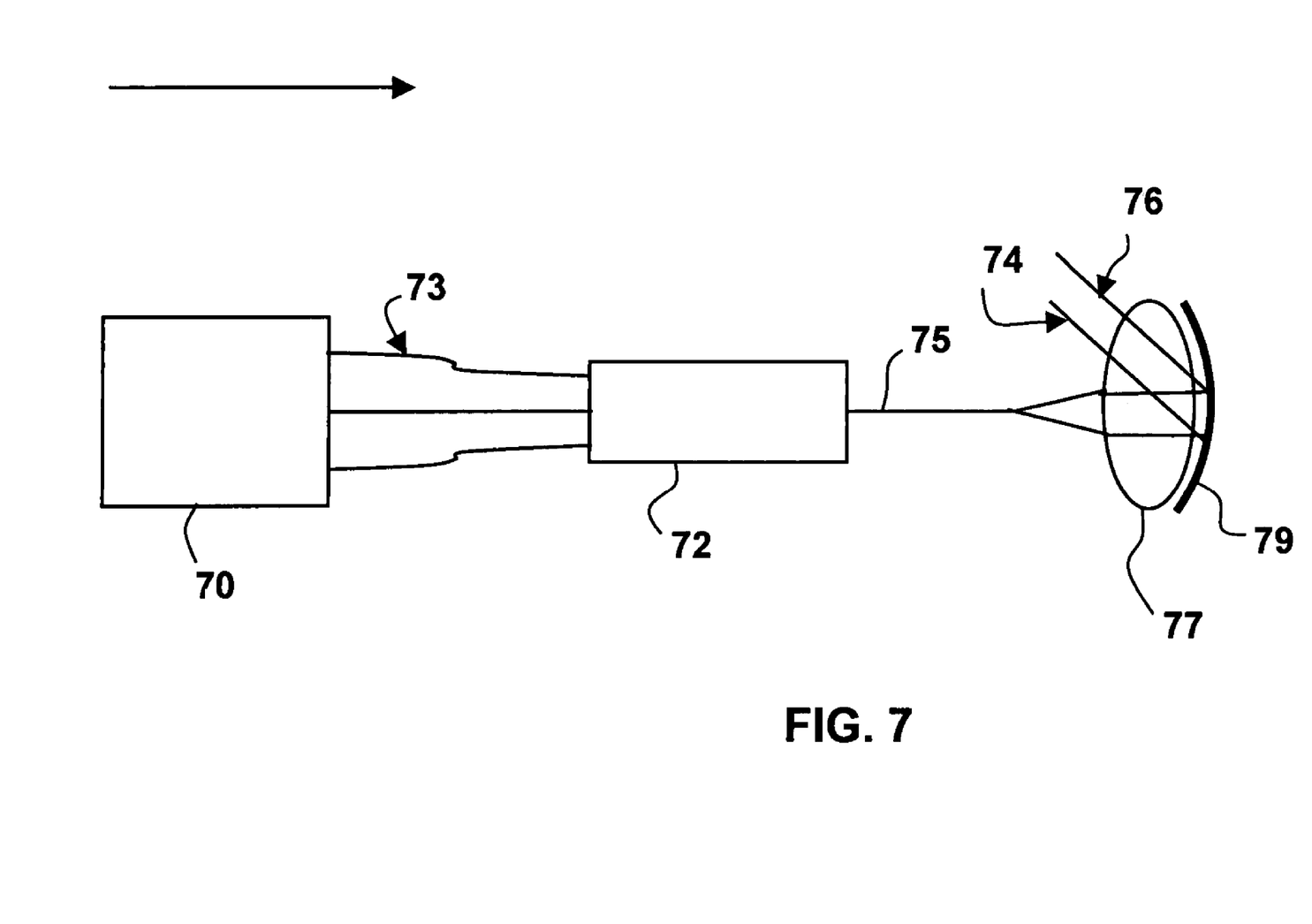
FIG. 7 is a schematic diagram illustrating an alternative embodiment of the invention wherein an element which is essentially totally reflective, provides two reflected beams.

Although the embodiments shown and described refer to an at least partially reflective element or volume hologram, it is within the scope of this invention to provide an element which is essentially totally reflective, providing two reflected beams; a feedback beam 74 and a reflected transmission beam 76 reflected off element 79 as shown in FIG. 7, instead of a transmitted transmission beam, reflected to a location out of the path of the feedback beam. In FIG. 7 a laser diode array 70 provides signals to plural optical fibers 73 whose output is combined by combiner 72. An optical fiber 75 guides the combined laser light to the lens 77.

What is claimed is:

1. A high power light source comprising:
    a plurality of laser diodes;
    a plurality of multimode waveguides each having an end optically coupled to one of the plurality of laser diodes so as to collect beams of light emitted from the plurality of laser diodes and guide said beams of light propagating in a forward direction to a first collection location and for guiding light traversing said multimode waveguides in an opposite direction to light from the plurality of laser diodes;
    an optical combiner disposed to receive the beams of light propagating in the forward direction from the first collection location and for combining said beams of light into a single forward propagating beam of light so that substantially all optical radiation within each beam of light overlaps the optical radiation each other beam to form the single beam, and for separating a received beam of light traversing in an opposite direction into separate beams of light at the collection location for providing optical feedback to the plurality of laser diodes; and
    an at least partially reflective element disposed to receive the single forward propagating beam of light for transmitting greater than 60% of the single forward propagating beam of light therethrough, and for reflecting between 3–40% of the single forward propagating beam back to the laser diodes as feedback to stabilize said laser diodes, wherein the at least partially reflective element has a reflectivity of >2% for ±2 nm from a center wavelength of 792 nm, 808 nm, 938 nm, or 976 nm.

2. A high power light source as defined in claim 1, further comprising a single multimode optical waveguide disposed between the optical combiner and the at least partially reflective element for guiding said single forward propagating beam of light towards the at least partially reflective element.

3. A high power light source as defined in claim 2, wherein the at least partially reflecting element is disposed within the single multimode optical waveguide or is directly coupled to an end thereof.

4. A high power light source as defined in claim 2, wherein the at least partially reflecting element is disposed adjacent an end of the single multimode optical waveguide.

5. A high power light source as defined in claim 4, further comprising means for substantially collimating light that has traversed the single multimode fiber in the forwards direction, on route to the at least partially reflecting element.

6. A high power light source as defined in claim 1, including means for substantially shaping the single forward propagating beam so that it is substantially collimated as it impinges upon the at least partially reflective element.

7. A high power light source as defined in claim 6, wherein the optical combiner combines the plurality of light beams into a single beam having a cross section that is substantially concentric about an optical axis along which it propagates.

8. A high power light source as defined in claim 1, wherein the at least partially reflective element is a volume Bragg grating.

9. A high power light source as defined in claim 1, wherein the laser diodes are discrete elements.

10. A high power light source as defined in claim 9 wherein the plurality of multimode waveguides are contained in a bundle.

11. A high power light source as defined in claim 2 wherein the at least partially reflective element is a filter deposited on an end of the single multimode optical waveguide, and wherein an end of a second multimode optical waveguide is coupled to an opposite side of the filter, so that the filter is sandwiched between the single optical waveguide and the second multimode waveguide.

12. A high power light source as defined in claim 2 wherein the single multimode mode waveguide comprises a first length of multimode optical fiber, a second length of multimode fiber and optical filter disposed between ends of the two lengths of optical fiber.

13. A high power light source comprising:
    a plurality of laser diodes;
    a plurality of multimode waveguides each having an end optically coupled to one of the plurality of laser diodes so as to collect beams of light emitted from the plurality of laser diodes and guide said beams of light propagating in a forward direction to a first collection location and for guiding light traversing said multimode waveguide in an opposite direction to light from the plurality of laser diodes;
    an optical combiner disposed to receive the beams of light propagating in the forward direction from the first collection location and for combining said beams of light into a single forward propagating beam of light so that substantially all optical radiation within each beam of light overlaps the optical radiation each other beam to form the single beam, and for separating a received beam of light traversing in an opposite direction into separate beams of light at the collection location for providing optical feedback to the plurality of laser diodes; and an at least partially reflective element disposed to receive the single forward propagating beam of light for transmitting greater than 60% of the single forward propagating beam of light therethrough, and for reflecting between 3–40% of the single forward propagating beam back to the laser diodes as feedback to stabilize said laser diodes, wherein the at least partially reflective element is a filter having a bandwidth of 1 to 7 nm with a reflectivity of 10 to 20%.

14. A high powered light source as defined in claim 13, wherein the reflectivity of 10 to 20% is for a beam having a center wavelengths of at least one of 792 nm, 808 nm, 915 nm, 938 nm, and 976 nm.

15. A high powered light source as defined in claim 13, further comprising a lens, wherein the filter is disposed on the lens.

16. A high powered light source as defined in claim 15, further comprising an optical fiber disposed between the combiner and the lens for guiding light between the filter and the combiner.

* * * * *